United States Patent [19]
Ito et al.

[11] Patent Number: 6,008,882
[45] Date of Patent: Dec. 28, 1999

[54] STAGE DEVICE, METHOD OF CONTROLLING SAME, AND EXPOSURE APPARATUS USING SAID STAGE DEVICE

[75] Inventors: Hirohito Ito, Funabashi; Kotaro Akutsu, Soka, both of Japan

[73] Assignee: Canon Kabushiki Kaisha, Tokyo, Japan

[21] Appl. No.: 08/982,526

[22] Filed: Dec. 2, 1997

[30] Foreign Application Priority Data

Dec. 5, 1996 [JP] Japan .................................. 8-339133

[51] Int. Cl.$^6$ ............................ G03B 27/42; G03B 27/58
[52] U.S. Cl. ............................................... 355/53; 355/72
[58] Field of Search .................................. 355/53, 50, 67, 355/77, 72–75; 356/399, 400, 401; 414/225, 321; 318/625, 632, 628, 687

[56] References Cited

U.S. PATENT DOCUMENTS

| | | | |
|---|---|---|---|
| 5,182,615 | 1/1993 | Kurosawa et al. | 356/400 |
| 5,184,055 | 2/1993 | Ohishi et al. | 318/615 |
| 5,382,095 | 1/1995 | Akutsu | 384/100 |
| 5,473,424 | 12/1995 | Okumura | 356/139.03 |
| 5,524,502 | 6/1996 | Osanai | 74/490.07 |
| 5,532,822 | 7/1996 | Shinozaki et al. | 356/363 |
| 5,696,590 | 12/1997 | Makita | 356/399 |
| 5,701,041 | 12/1997 | Akutsu et al. | 310/12 |
| 5,717,482 | 2/1998 | Akutsu et al. | 355/53 |
| 5,726,548 | 3/1998 | Chiba et al. | 318/625 |
| 5,760,561 | 6/1998 | Chinju et al. | 318/593 |
| 5,883,702 | 3/1999 | Tokunaga | 355/53 |

*Primary Examiner*—Safet Metjahic
*Assistant Examiner*—Hung Henry Nguyen
*Attorney, Agent, or Firm*—Fitzpatrick, Cella, Harper & Scinto

[57] ABSTRACT

A precision stage is provided so as to be movable along the Z axis, in the θ direction, which is the direction of rotation about the Z axis, and in two oblique directions inclined with respect to the Z axis. The stage has a sensor for measuring stage position along the Z axis. Reference-position return of this sensor is carried out. Reference-position return of two Y laser interferometers for measuring the θ position of the precision stage is carried out in a state in which the positions of the precision stage in the direction along the Z axis and in the oblique directions are held at predetermined reference positions. After this reference-position return is carried out, reference-position return is performed with regard to an X laser interferometer and the two Y laser interferometers in a state in which the positions of the precision stage in the direction along the Z axis, in the oblique directions and in the θ direction are held at predetermined reference positions.

10 Claims, 13 Drawing Sheets

STAGE DEVICE, METHOD OF CONTROLLING SAME, AND EXPOSURE APPARATUS USING SAID STAGE DEVICE

BACKGROUND OF THE INVENTION

This invention relates to an exposure apparatus used to manufacture a semiconductor device or the like by exposing a resist on a substrate to a design pattern, a method of manufacturing devices using this exposure apparatus, and a stage device and reference-position return method applicable to this apparatus and method.

Examples of such exposure apparatus generally used to manufacture semiconductor devices include a stepper which sequentially exposes a plurality of exposure areas on a substrate such as a wafer to a pattern on a reticle via a projecting optical system while the substrate is moved in steps, and a scanning-type exposure apparatus which moves a reticle such as a mask and a substrate relative to a projecting optical system and scans the reticle and the substrate by slit-shaped exposing light to thereby expose the substrate to the pattern on the reticle by scanning.

A step-and-scan-type exposure apparatus has been proposed in recent years. This apparatus exposes a plurality of areas on a substrate to a fine pattern in a highly precise fashion by repeating the above-mentioned stepping motion and scanning exposure in such a manner that exposure of a fine pattern can be carried out with greater accuracy. This exposure apparatus is so adapted that exposing light is limited by a slit so that only a portion of the light comparatively near the optical axis of the projecting optical system is used. This makes possible the exposure of a fine pattern with improved accuracy.

However, a problem with the conventional exposure apparatus is that the positioning accuracy of the substrate exposed to light and the accuracy of movement in the scanning direction are not adequate, to achieve exposure of the fine patterns at the high precision mentioned above.

A precision stage capable of being driven along a plurality of axes is provided in the above-described exposure apparatus in order to make possible the fine positioning of the stage that carries the substrate. In general, the precision stage is capable of fine movement along the Z axis, which coincides with the direction of the optical axis of the exposing light, along a direction inclined with respect to the Z axis, and in a direction of rotation about the Z axis.

Since the precision stage has a plurality of axes along which it is driven, however, this makes it much more difficult to return the precision stage to its reference position accurately. Measuring the position of the stage accurately by laser interferometty or the like cannot be carried out and accuracy of movement cannot be maintained at a high level unless the precision stage is returned to its reference position accurately.

SUMMARY OF THE INVENTION

Accordingly, an object of the present invention is to improve the positioning accuracy and accuracy of movement in the scanning direction of a substrate exposed to light in an exposure apparatus and to provide a method of manufacturing devices using the exposure apparatus.

Another object of the present invention is to improve the accuracy of a reference-position return operation in a stage device.

According to an embodiment of the present invention, the foregoing objects are attained by providing a stage device comprising a stage provided so as to be movable in a direction along a Z axis, in a θ direction, which is a direction of rotation about the Z axis, and in two oblique directions inclined with respect to the Z axis, drive means for moving the stage in each of these directions, θ-position measuring means for obtaining position of the stage in the θ direction, and control means for controlling the drive means and the θ-position measuring means, wherein the control means holds the position of the stage in the direction along the Z axis and the position of the stage in the oblique directions at prescribed reference positions and performs reference-position return of the θ-position measuring means in this state. An example of the θ-position measuring-means is means for measuring positions of parts of the stage on at least two measurement axes and obtaining the position of the stage in the θ direction based upon results of this measurement.

According to an embodiment of the present invention, the stage device further comprises an XY stage carrying the stage and provided so as to be movable in X and Y directions, drive means for moving the XY stage in the X and Y directions, and X and Y position measuring means for measuring position of the stage in the X and Y directions by sensing positions of a portion of the stage on prescribed axes of measurement, wherein the control means holds the position of the stage along the Z axis, the position of the stage in the oblique directions and the position of the stage in the θ direction at prescribed reference positions after performing reference-position return of the θ-positionmeasuring means, and performs reference-position return of the X and Y position measuring means in this state.

According to an embodiment of the present invention, the stage device further comprises Z position measuring means for measuring the position of the stage in the Z direction at least at three points, wherein the control means performs reference-position return of the Z position measuring means for performing reference-position return of the θ position measuring means.

According to an embodiment of the present invention, the control means performs reference-position return of each of the measuring means by moving the relevant stage by the relevant drive means in the direction of a prescribed stopper which corresponds to the measuring means, holding the output of this drive means at a predetermined value for a fixed period of time starting when the load of this drive means exceeds a fixed value or when the traveling speed of this stage falls below a fixed value, and then initializing this measuring means.

According to an embodiment of the present invention, the direction along the direction of the Z axis is the vertical direction and the stage device further includes a dead-load compensating mechanism which, when movement is performed along the Z axis by the drive means, is for compensating for the load due to the force of gravity in this direction, wherein the control means performs reference-position return of each of the measuring means by moving the stage by the drive means in the direction of a prescribed stopper which corresponds to the measuring means, stops the operation of the dead-load compensating mechanism when the load of the drive means exceeds a fixed value or when the speed of the stage falls below a fixed value, holds the output of this drive means at a predetermined value for a fixed period of time starting at this time and then initializes the measuring means.

According to an embodiment of the present invention, the foregoing objects are obtained by providing a method for performing reference-position return, wherein when reference-position return is performed in θ position measuring means for obtaining θ direction position of a stage provided so as to be movable in a direction along a Z axis, in a θ direction, which is a direction of rotation about the Z axis, and in two oblique directions inclined with respect to the Z axis, the position of the stage in the direction along the Z axis and the position of the stage in the oblique directions are held at prescribed reference positions. The θ position measuring means measures positions of a portion of the stage on at least two measurement axes and obtains the position of the stage in the θ direction based upon results of this measurement.

Further, performing reference-position return of X and Y position measuring means for measuring X- and Y-direction positions of an XY stage, which carries the above-mentioned stage and is movable in X and Y directions, is performed in a state in which the position of the stage along the Z axis, the position of the stage in the oblique directions and the position of the stage in the θ direction are held at prescribed reference positions after reference-position return of the θ-position measuring means is performed.

Further, reference-position return of Z position measuring means, which measures the position of the stage in the Z direction at least at three points, is performed before the reference-position return of the θ position measuring means is performed.

In these cases, reference-position return of each of the measuring means is performed by moving the relevant stage by the relevant drive means in the direction of a prescribed stopper which corresponds to the measuring means, holding the output of this drive means at a predetermined value for a fixed period of time starting when the load of this drive means exceeds a fixed value or when traveling speed of this stage falls below a fixed value, and then initializing this measuring means.

According to an embodiment of the present invention, in a case wherein the direction of the Z axis is the vertical direction and, when the stage is moved in this direction by z drive means, dead-load compensation for compensating for the load due to the force of gravity in this direction is performed, reference-position return of the Z position measuring means is performed by moving the stage by the Z drive means in the direction of a corresponding prescribed stopper, stopping the dead-load compensating operation when the load of the drive means exceeds a fixed value or when the speed of the stage falls below a fixed value, holding the output of the Z drive means at a predetermined value for a fixed period of time starting at this time and then initializing the Z position measuring means.

According to an embodiment of the present invention, there is provided an exposure apparatus having the above-described stage device, wherein the direction along the Z axis thereof coincides with the direction of the optical axis of exposing light and a substrate to be exposed to light is carried on the stage device.

According to an embodiment of the present invention, there is provided a method of manufacturing a device in which reference-position return of a stage provided on an exposure apparatus and having an optical axis of exposing light as a direction along the z axis is performed by the above-described method, after which a substrate to be exposed to light placed on the stage is exposed.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

[First Embodiment]

Preferred embodiments of the present invention will now be described in detail in accordance with the accompanying drawings.

Figure 1:
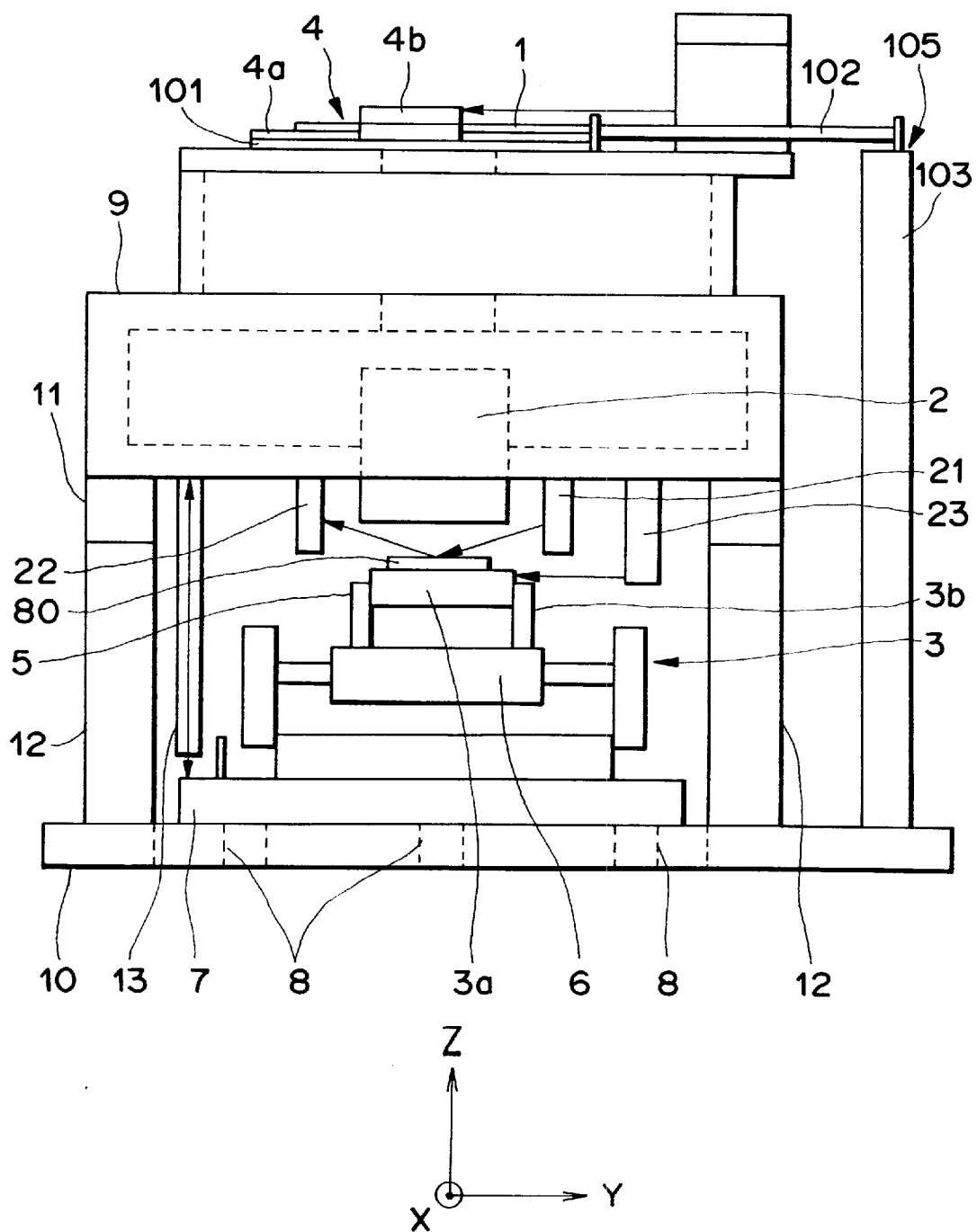
FIG. 1 is a schematic view illustrating a side view of an exposure apparatus according to a first embodiment of the present invention.
Figure 2:
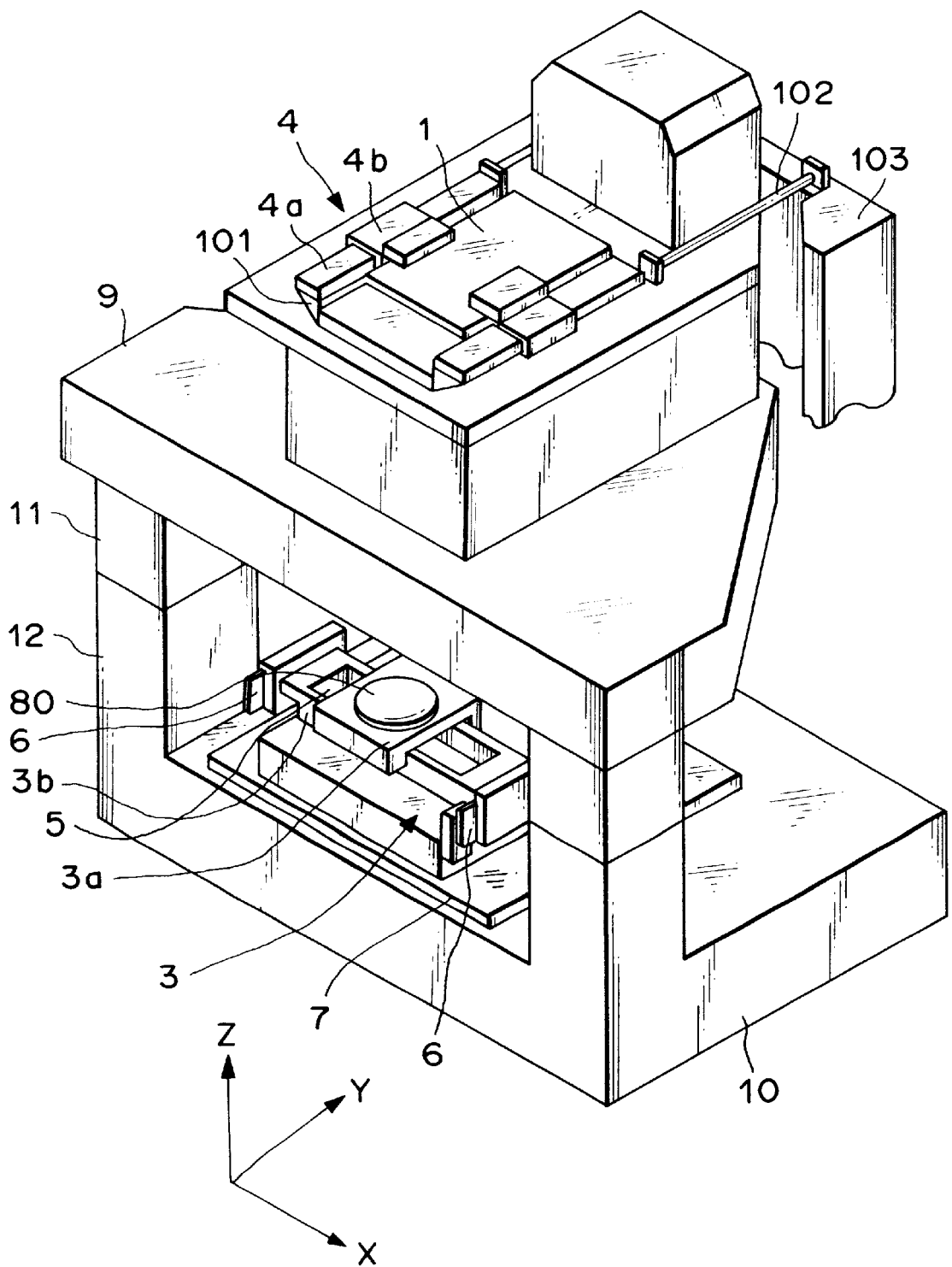
FIG. 2 is a perspective view illustrating the external appearance of the exposure apparatus shown in FIG. 1.

FIG. 1 is a schematic view illustrating a side view of an exposure apparatus according to an embodiment of the present invention, and FIG. 2 is a perspective view illustrating the external appearance of the exposure apparatus. This exposure apparatus is a so-called step-and-scan exposure apparatus so adapted that part of the pattern of a reticle is projected onto a wafer on a precision stage device 80 provided on an XY stage device 3 via a projecting optical system 2, the reticle and wafer are scanned synchronously in the Y direction with respect to the projecting optical system 2 to thereby expose the wafer to the pattern of the reticle, and the scanning exposure is performed while interposing stepping motion in order to repeatedly perform the exposure with respect to a plurality of areas on the wafer.

Movement of the reticle in the scanning (Y) direction is performed by a stage device on the reticle side. The stage device on the reticle side has a linear motor 4 which moves a movable element 4b in the scanning direction (Y direction) by applying thrust between a stator 4a and the movable element 4b. A reticle stage 1 is joined to the movable element 4b. The stator 4a is supported by a first supporting member 101 with a degree of freedom in the Y direction. Further, the stator 4a is supported by a second supporting member 105 rigidly in the Y direction and flexibly in other directions. The second supporting member 105 has a column 103 extending upwardly from a base frame 10, and an axial supporting member 102 extending in the Y direction from the column 103 for supporting the stator 4a rigidly in the Y direction and flexibly in other directions.

The reticle stage 1 is driven in the Y direction by the linear motor 4. The XY stage device 3 has an X stage 3a driven in the X direction by a linear motor 5 and a Y stage 3b driven in the Y direction by a linear motor 6. Synchronous scanning of the reticle and wafer is carried out by driving the reticle stage 1 and Y stage 3b in the Y direction at a fixed velocity ratio (e.g., 4:1). Stepping in the X direction is performed by the X stage 3a.

The XY stage device 3 is provided on a stage table 7, which is supported on a platform or the like at three points via three dampers 8. The first supporting member 101 and the optical system 2 are provided on an optical stand 9, which is supported on the base frame 10 via three dampers 11 and three struts 12. Here, each damper 8 is an active damper which actively suppresses or eliminates vibration along six axes. However, a passive damper may be used or the stage table 7 may be supported without the intervention of dampers.

Reference numeral 13 denotes a stage table surface position sensor provided for measuring a space between an optical stand 9 supporting the projecting optical system 2 and a stage table 7. Reference numerals 21 and 22 denote a light emitting unit and a photoreceptor unit, respectively, which constitute wafer surface position measuring devices for measuring the position of a wafer in the direction Z and a deviation of the wafer from the XY plane on the precise stage 80 situated opposite to the projecting optical system 2 (image forming position). The light emitting unit 21 irradiates light on the surface of the wafer, and the light reflected upon the wafer is received by an image sensor incorporated in the photoreceptor unit 22. By detecting the position at which the light is received by the image sensor, the position of the wafer in the direction Z and the deviation from the XY plane are obtained.

In the arrangement set forth above, a wafer is transported onto the XY stage device 3 along the conveyance path between the two struts 12 at the front of the apparatus by a conveyance mechanism, which is not shown. When prescribed positioning is completed, the exposure apparatus exposes a plurality of exposure areas on the wafer to the pattern on the reticle to effect transfer of the pattern to the wafer while repeating scanning exposure and stepping movement. In scanning exposure, the reticle stage 1 and Y stage 3b are moved at a predetermined velocity ratio along the Y direction (scanning direction) to scan the pattern on the reticle by the slit-shaped exposing light and scan the wafer by the projected image, whereby a prescribed area on the wafer is exposed to the pattern on the reticle. When the scanning exposure of one exposure area is finished, the X stage 3a is driven along the X direction to step the wafer. As a result of such stepping, another exposure area is positioned at the scanning exposure starting position and scanning exposure is carried out. It should be noted that the disposition of each exposure area, the scanning direction (either the positive Y direction or the negative Y direction) and the order in which the exposure areas are exposed have been set in such a manner that the plurality of exposure areas on the wafer can be successively exposed in an efficient manner by the combination of the stepping movement in the X direction and movement for scanning exposure in the Y direction.

Figure 3:
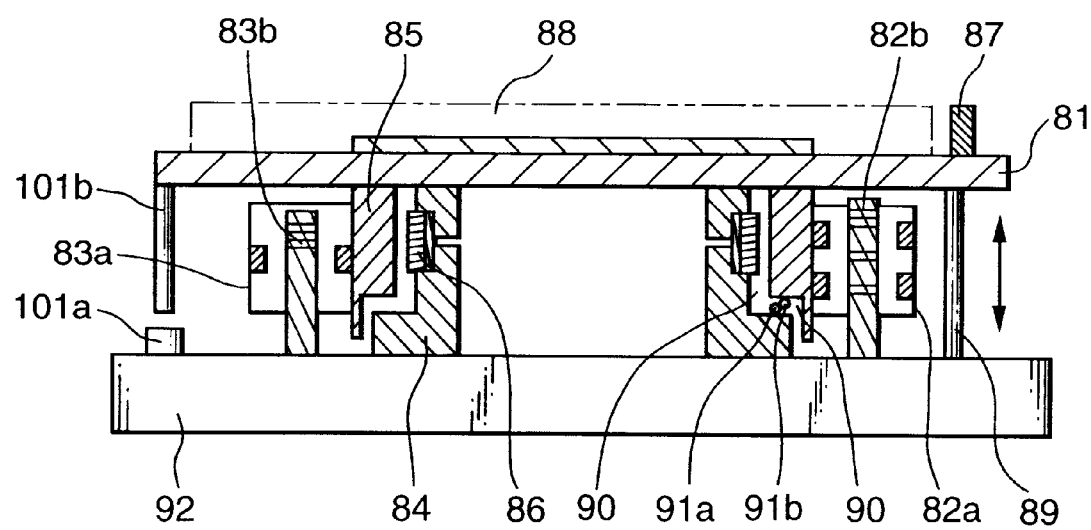
FIG. 3 is a sectional view illustrating a precision stage device in the apparatus of FIG. 1.
Figure 4:
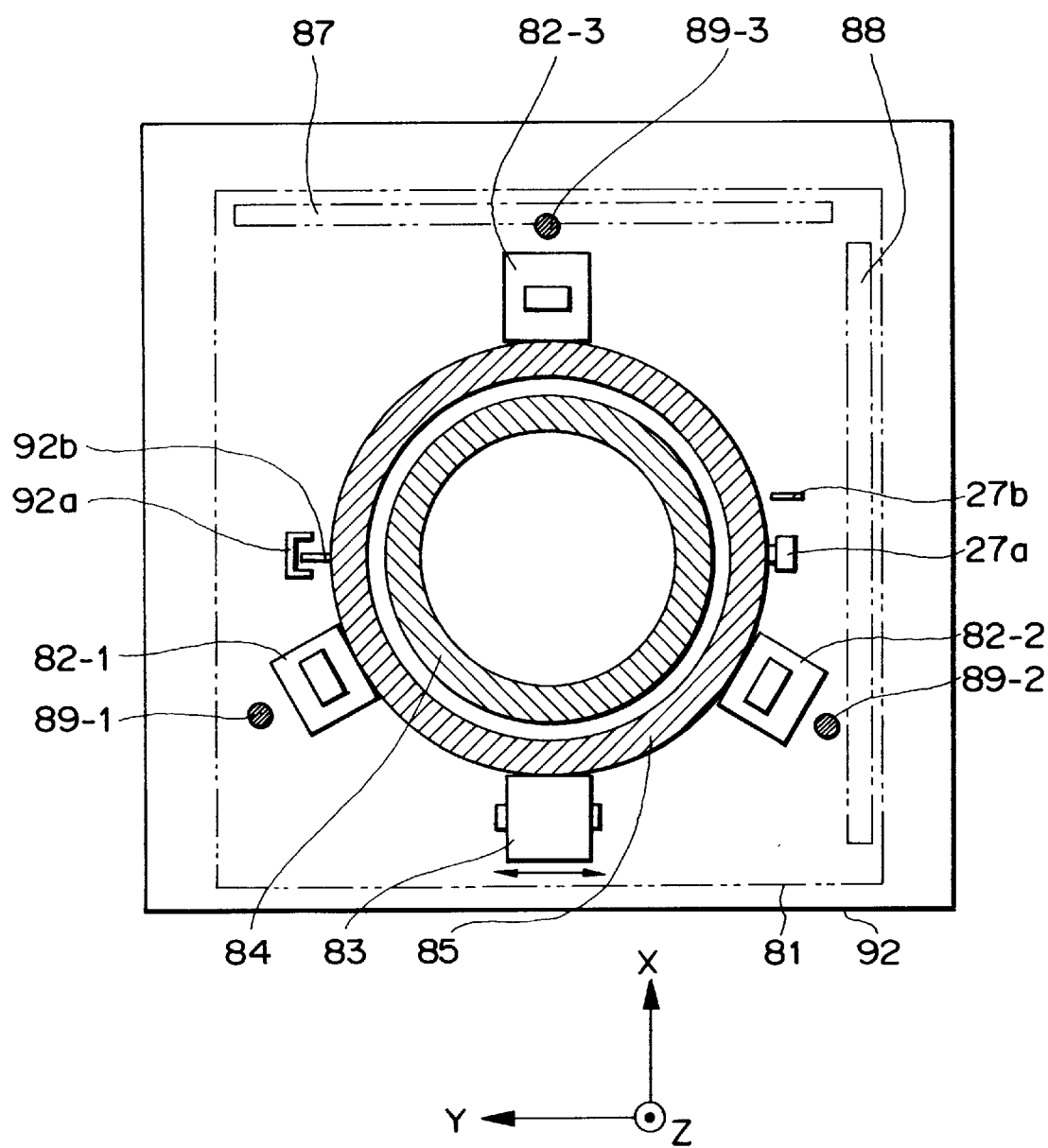
FIG. 4 is a plan view illustrating the precision stage device in the apparatus of FIG. 1.

FIGS. 3 and 4 are sectional and plan views, respectively, of the precision stage device 80. The precision stage device 80 is in accordance with the embodiment of the stage device according to the present invention.

Figure 12:
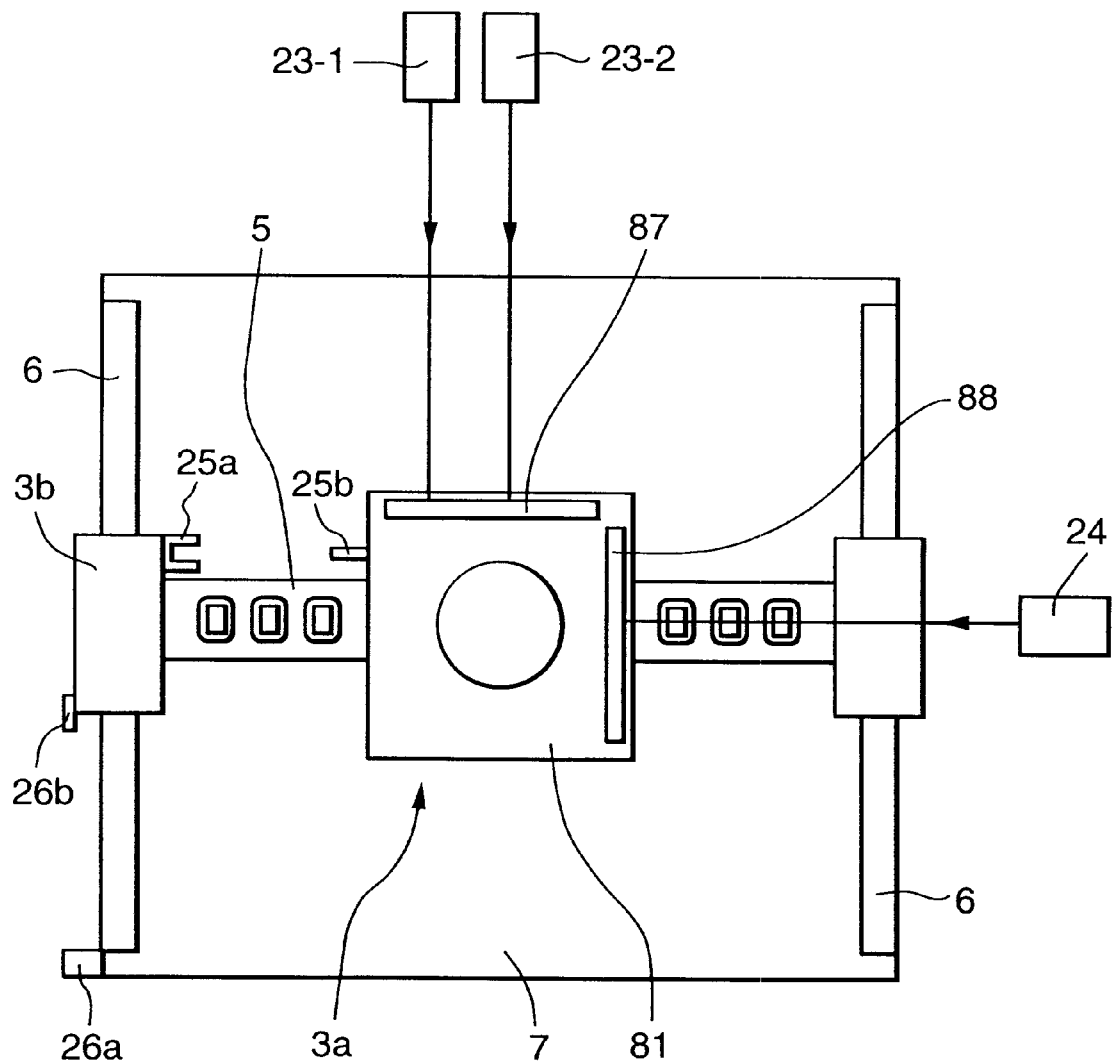
FIG. 12 is a schematic view showing a sensor arrangement for measuring the X and Y positions of a precision stage according to the first embodiment.
Figure 13:
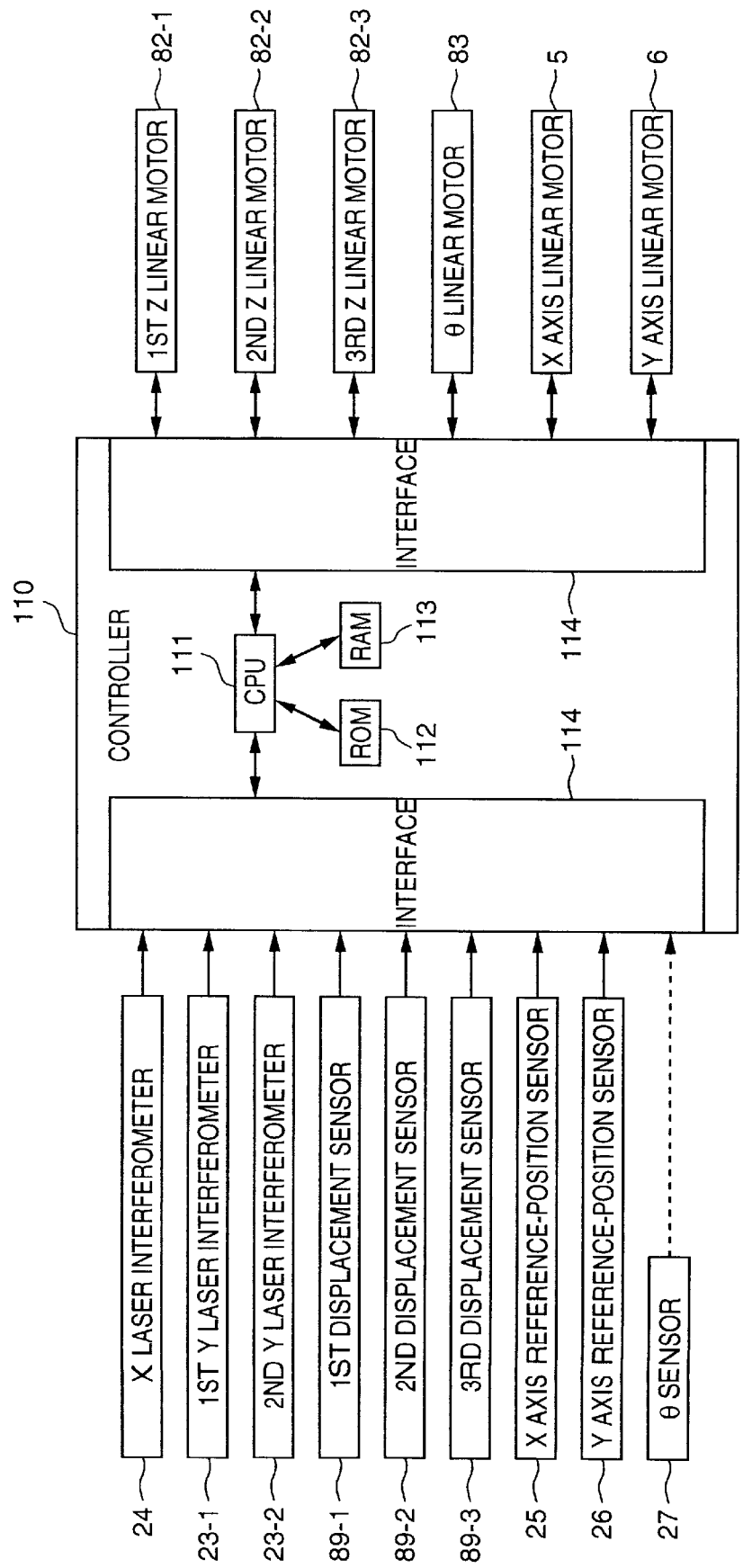
FIG. 13 is a block diagram useful in describing a controller according to the first embodiment.

As shown in FIGS. 3 and 4, the precision stage device 80 has a precision stage 81 provided so as to be movable in the direction along the Z axis, in the $\theta$ direction, which is the direction of rotation about the Z axis, and in two oblique directions inclined with respect to the Z axis, and linear motors 82-1, 82-2, 82-3 and 83 for moving the precision stage 81 in each of these directions. Further, as shown in FIG. 12, the precision stage device 80 has two Y laser interferometers 23-1, 23-2 for measuring the positions of a portion of the precision stage 81 along at least two measurement axes and for obtaining, from the results of measurement, the positions of the precision stage 81 in the $\theta$ direction and Y direction, and an X laser interferometer 24 for obtaining the position of the precision stage 81 in the X direction. Further, as shown in FIG. 13, there is provided a controller 110 for controlling the two Y laser interferometers 23-1, 23-2, the X laser interferometer 24 and the linear motors 82, 83, etc. The controller 110 holds the positions of the precision stage 81 along the Z axis and in the oblique directions at prescribed reference positions and essentially performs reference-position return in regard to position in the $\theta$ direction with respect to two of the laser interferometers mentioned above. The details will be described later.

The precision stage 81 is mounted, via a fixing member 84 and guide member 85, on a base 91 secured to the X stage 3a (FIG. 1.) The fixing member 84 is secured to the base 91 and the guide member 85 is secured to the precision stage 81. The guide member 85 is capable of being guided along the Z axis, in the $\theta$ direction and in the oblique directions with respect to the Z axis by the fixing member 84. A guide surface on the fixing member 84 is provided with a porous pad 86. The precision stage 81 is guided in contactless fashion by supplying an air stream from the pad 86.

Each of the three linear motors 82-1 through 82-3 has a movable element 82a secured to the guide member 85 and a stator 82b secured to the base 91. The guide member 85 is driven in the Z direction at each of three points, whereby the precision stage 81 is driven in the Z direction with respect to the base 91 and is capable of being inclined with respect to the Z axis. The linear motor 83 has a movable element 83a secured to the guide member 85 and a stator 83b secured to the base 91 so that the precision stage 81 may be driven in the $\theta$ direction with respect to the base 91. Hereafter, the linear motors 82-1~82-3 shall be referred to as Z linear motors 82-1~82-3 and the linear motor 83 shall be referred to as a $\theta$ linear motor 83.

A Y mirror 87 irradiated by the two Y laser interferometers 23-1, 23-2 for obtaining the positions of precision stage 81 in the $\theta$ and Y directions and an X mirror 88 irradiated by the X laser interferometer 24 for measuring the position of the precision stage 81 in the X direction are secured to the precision stage 81.

Displacement sensors 89-1~89-3 secured to the base 91 are provided in the vicinity of the Z linear motors 82-1~82-3 and measure the Z-axis displacement of the precision stage 81 in the vicinity of the linear motors 82-1~82-3. Linear motors or the like can be used as the displacement sensors 89-1~89-3.

A pilot-pressure chamber 90 is provided between the fixing member 84 and the guide member 85. By applying pilot pressure internally of the pilot-pressure chamber 90 when the Z linear motors 82-1~82-3 are driven, it is possible to compensate for load upon the Z linear motors 82-1~82-3 due to the force of gravity acting on the precision stage 81 and the like.

Further, the fixing member 84 and guide member 85 are provided with stoppers 91a, 91b, respectively, at three locations in the vicinity of the Z linear motors 82-1~82-3. The precision stage 81 can be held at a prescribed position along the Z axis and at a prescribed inclination by bringing these stoppers into abutting contact.

As shown in FIG. 4, a stopper plate 92b is fixed on the guide member 85 and a stopper 92a is fixed on the base 91.

FIG. 13 is a block diagram illustrating the construction of the control system according to this embodiment. As shown in FIG. 13, the controller 110 includes a CPU 111 for implementing a variety of control operations by executing a control program stored in a ROM 112. In addition to this control program, the ROM 112 stores a control program for implementing control illustrated in the flowchart of FIG. 5, described later. A RAM 113 provides a working area necessary when the CPU 111 executes various control operations. An interface 114 connects various sensors and drive devices.

Connected to an interface for inputs to the controller 110 are the X laser interferometer 24, the Y laser interferometers 23-1, 23-2, the displacement sensors 89-1~89-3, an X-axis reference-position sensor 25 and a Y-axis reference-position sensor 26.

Connected to an interface for outputs from the controller 110 are the Z linear motors 82-1~82-3, the θ linear motor 83, the X-axis linear motor 5 and the Y-axis linear motor 6. These are controlled by the controller 110.

Figure 5:
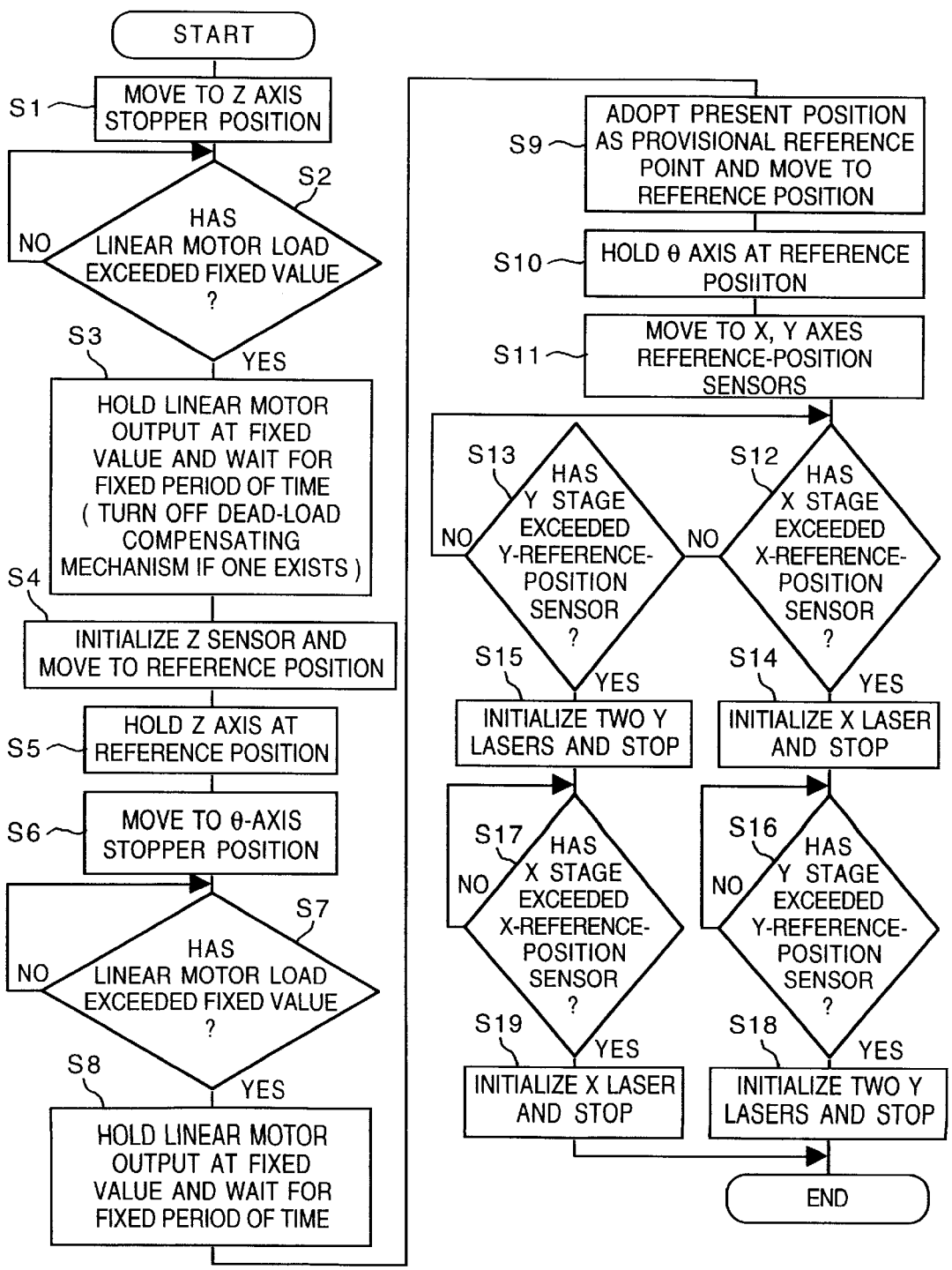
FIG. 5 is a flowchart illustrating a reference-position return operation in the precision stage device and in an XY stage device of the apparatus shown in FIG. 1.

FIG. 5 is a flowchart illustrating a reference-position return operation in the precision stage device 80 and in the XY stage device 3. Control for the reference-position return operation is carried out by the controller 110. Reference-position return is carried out first with regard to the displacement sensors 89-1~89-3, which measure position in the Z direction. More specifically, as illustrated in the flowchart of FIG. 5, the Z linear motors 82-1~82-3 are driven so as to lower the precision stage 81 (step S1). The stoppers 91a, 91b come into abutting contact with each other and whether the load upon each of the Z linear motors 82-1~82-3 has exceeded a predetermined value is sensed (step S2). If it is sensed that the predetermined value has been exceeded, the output of each of the Z linear motors 82-1~82-3 is held at a fixed value, the application of pilot pressure to the pilot-pressure chamber 90 is halted and the system waits for passage of a predetermined period of time under these conditions (step S3). Upon an elapse of the predetermined period of time, each of the displacement sensors 89-1~89-3 is initialized and reference-position return of each of the displacement sensors 89-1~89-3 is terminated. The Z linear motors 82-1~82-3 are driven using the displacement sensors 89-1~89-3 for which reference-position return has been performed, whereby the precision stage 81 is moved to a predetermined reference position (step S4).

The reason for halting the application of pilot pressure to the pilot-pressure chamber 90 at step S3 is to prevent a situation in which the force at which the stoppers strike each other varies owing to a fluctuation in pilot pressure, which would make it impossible to assure an accurate position at which the stoppers contact each other. Further, instead of sensing that the load of each of the Z linear motors 82-1~82-3 has exceeded a predetermined value at step S2, an arrangement may be adopted in which it is sensed whether the speed of the precision stage 81 has fallen below a fixed value.

For example, if the fixed value is set to a value which is lower than a noise level of a sensor, an accuracy of the stop of movement of the stage 8 can be maintained.

Next, reference-position return in regard to the X and Y laser interferometers is carried out. More specifically, while the reference position of step S4 is maintained (step S5), the θ linear motor 83 is driven to rotate the precision stage 81 in the θ direction until the stopper plate 92b (shown in FIG. 4) is contacted with the stopper 92a (steps S5, S6). Whether the load on the θ linear motor 83 has exceeded a predetermined value is then sensed (step S7). If it is sensed that the load has exceeded the predetermined value, then the output of the θ linear motor 83 is held fixed and the system waits for passage of a predetermined period of time (step S8). Upon an elapse of the predetermined period of time, the positions measured by the two laser interferometers 23-1, 23-2 and by the X laser interferometer 24 at this time are adopted as the provisional reference positions (step S9). This in effect implements reference-point return of the sensors in regard to the θ direction of the two Y laser interferometers 23-1, 23-2. The θ linear motor 83 is subsequently driven and the position of the precision stage 81 in the θ direction is adopted as a prescribed reference position (step S9). Further, instead of sensing that the load of the θ linear motor 83 has exceeded a predetermined value at step S7, an arrangement may be adopted in which it is sensed whether the rotating speed of the precision stage 81 has fallen below a fixed value.

Figure 8:
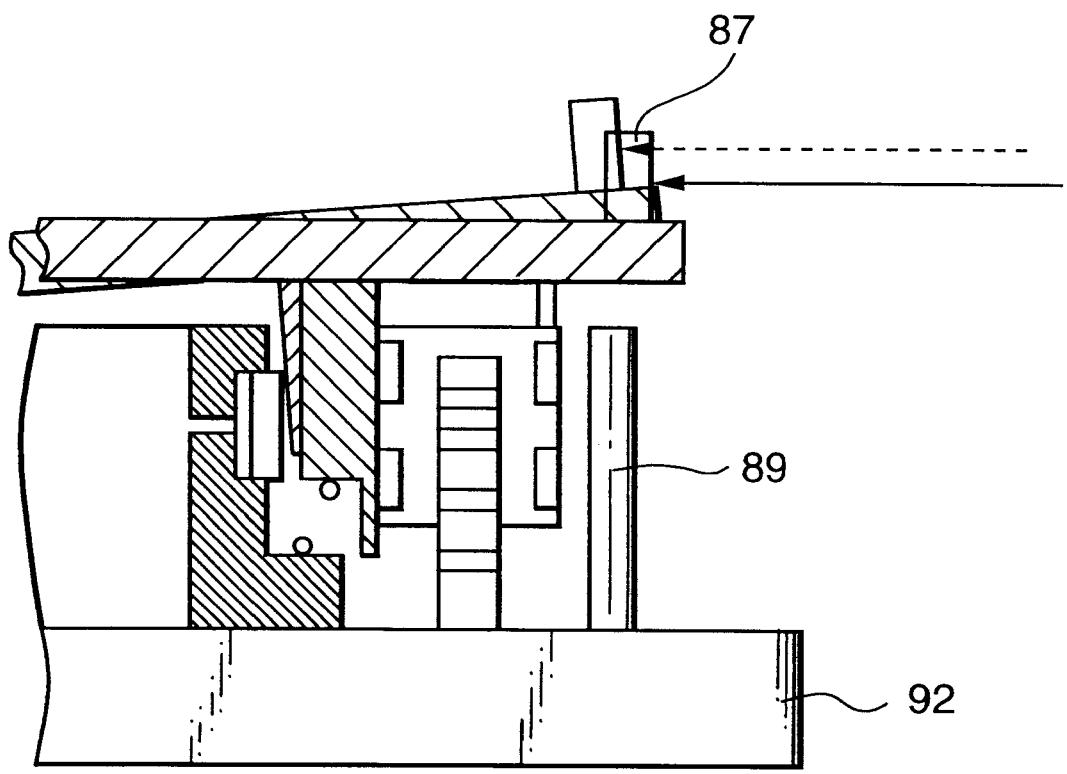
FIG. 8 is a diagram showing Abbe error due to inclination with respect to the Z axis in the precision stage.

Thus, after reference-point return of the displacement sensors 89-1~89-3 along the Z axis is carried out, reference-point return with regard to the position in the θ direction is performed. As a result, reference-point return, with regard to the θ direction, of the two Y laser interferometers 23-1, 23-2 can be carried out in a state in which position along the X axis and inclination with respect to the Z axis are held at predetermined values at all times. Consequently, at the time of measurement by the Y laser interferometers 23-1, 23-2 in reference-point return, the effects of Abbe error due to tilting of the Y mirror 87 as shown in FIG. 8 are eliminated and reference-point return can be carried out accurately at all times.

Next, with position in the θ direction held at the above-mentioned reference position, the X stage 3a and Y stage 3b are moved toward X- and Y-direction reference-position sensors 25, 26, respectively, (steps S10, S11) and whether the respective reference-position sensors have been exceeded is sensed. As shown in FIG. 12, the X-direction reference position sensor 25 comprises photo sensor 25a mounted on the Y stage 3b and a plate 25b mounted on the X stage 3a. The Y-direction reference position sensor 26 comprises photo sensor 26a mounted on the stage table 7 and a plate 26b mounted on the Y stage 3b. When the X stage 3a has exceeded the reference-position sensor, the X laser interferometer 24 is initialized and the X stage 3a (the X-axis linear motor 5) is halted. When the Y stage 3b has exceeded the reference-position sensor, the two Y laser interferometers 23-1, 23-2 are initialized and the Y stage 3b (the Y-axis linear motor 6) is halted (steps S12~S19).

Figure 9:
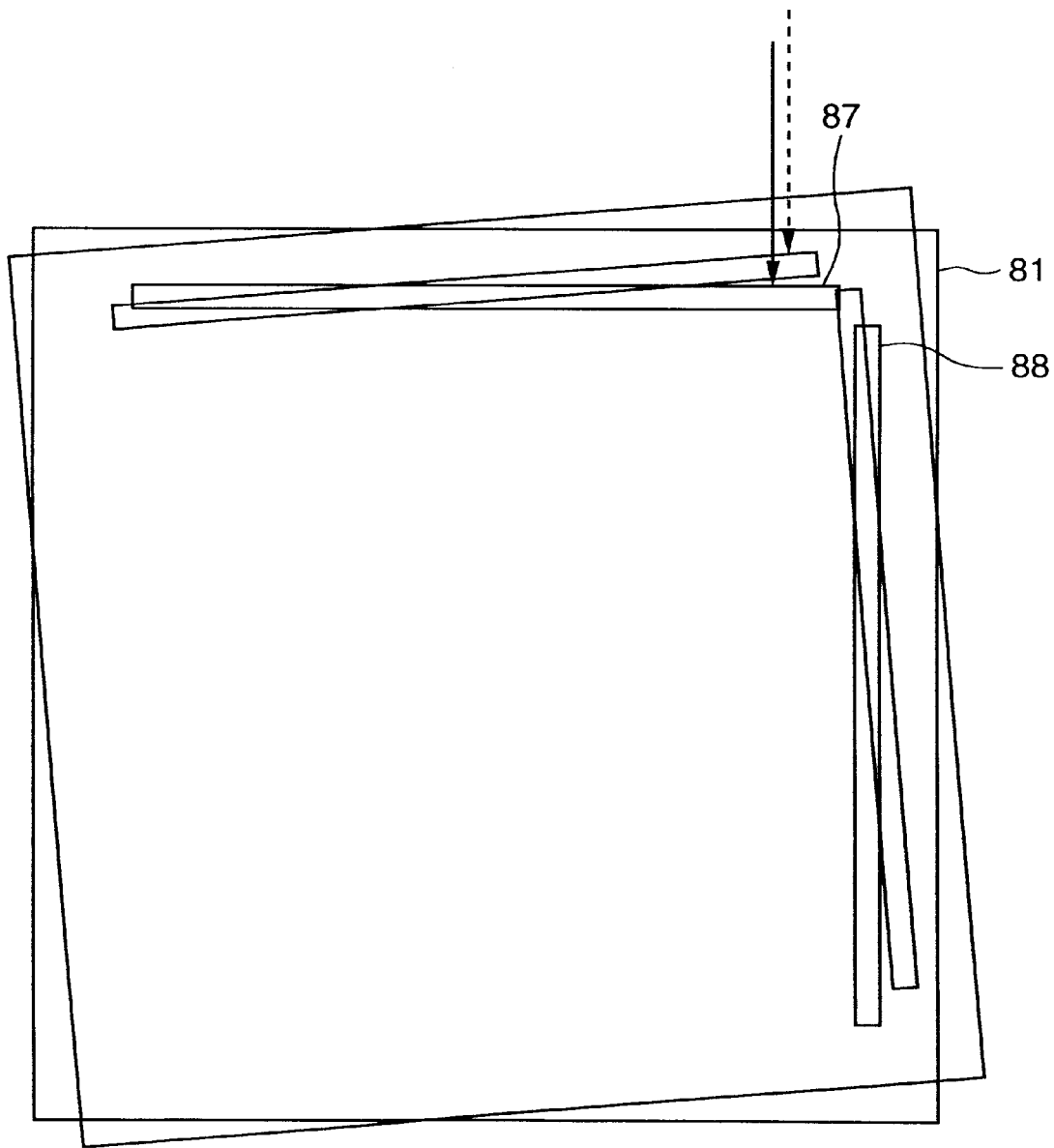
FIG. 9 is a diagram showing Abbe error due to inclination in the θ direction in the precision stage.

Thus, following reference-point return of the displacement sensors 89-1~89-3 along the Z axis and the substantial reference-point return of the two Y laser interferometers 23-1, 23-2 in the θ direction, reference-point return of the X and Y laser interferometers with regard to the directions along the X and Y axes is carried out. As a result, reference-point return can be carried out in a state in which the positions and attitudes of the X mirror 88 and Y mirror 87 are kept at predetermined values at all times. In other words, the effects of Abbe error due to tilting of the X mirror 88 and Y mirror 87 with respect to the Z axis, as shown in FIGS. 8 and 9, and caused by a fluctuation in position in the θ direction can be completely eliminated and reference-point return can be carried out accurately at all times.

It should be noted that besides the two laser interferometers serving as the sensors for the θ axis, a displacement sensor 27 which measures the displacement between the precision stage 81 and the base 91 along-the θ axis may be provided, with this sensor being used only at the time of reference-point return. As shown in FIG. 4, the displacement sensor 27 comprises a static capacitor sensor 27a mounted on the guide member 85 and a target member 27b mounted on the base 91. In such a case, the reference-point return displacement sensor 27 would be used for control along the θ axis from operation for reference-point return along the θ axis to initialization of the Y-axis laser interferometers 23-1, 23-2. At initialization of the Y-axis laser interferometers 23-1, 23-2, the θ axis would be held at the reference position by the reference-point return displacement sensor 27. After initialization, a changeover would be made to θ-axis control using the interferometers.

Since XY reference-point return is not finished when the θ reference-point return is performed, the positions along the X and Y axes are not known and the positions at which the laser is impinging on the mirrors also is unknown. Mirrors may exhibit distortion or curvature due to machining. When θ-axis control is performed with a laser reference, therefore, the θ axis rotates in accordance with mirror distortion or the like in the process of movement toward the XY reference point and there is a possibility that the axis will not be held at the accurate reference position when laser initialization is performed. Accurate reference-point return is made possible by using the reference-point return displacement sensor 27, which is not susceptible to-the effects of movement along the X and Y axes, as mentioned above.

An arrangement may be adopted in which two lasers along the direction of the X axis are used for θ measurement instead of two lasers along the direction of the Y axis.

An example of manufacture of a device in which this exposure apparatus can be utilized will be described.

Figure 10:
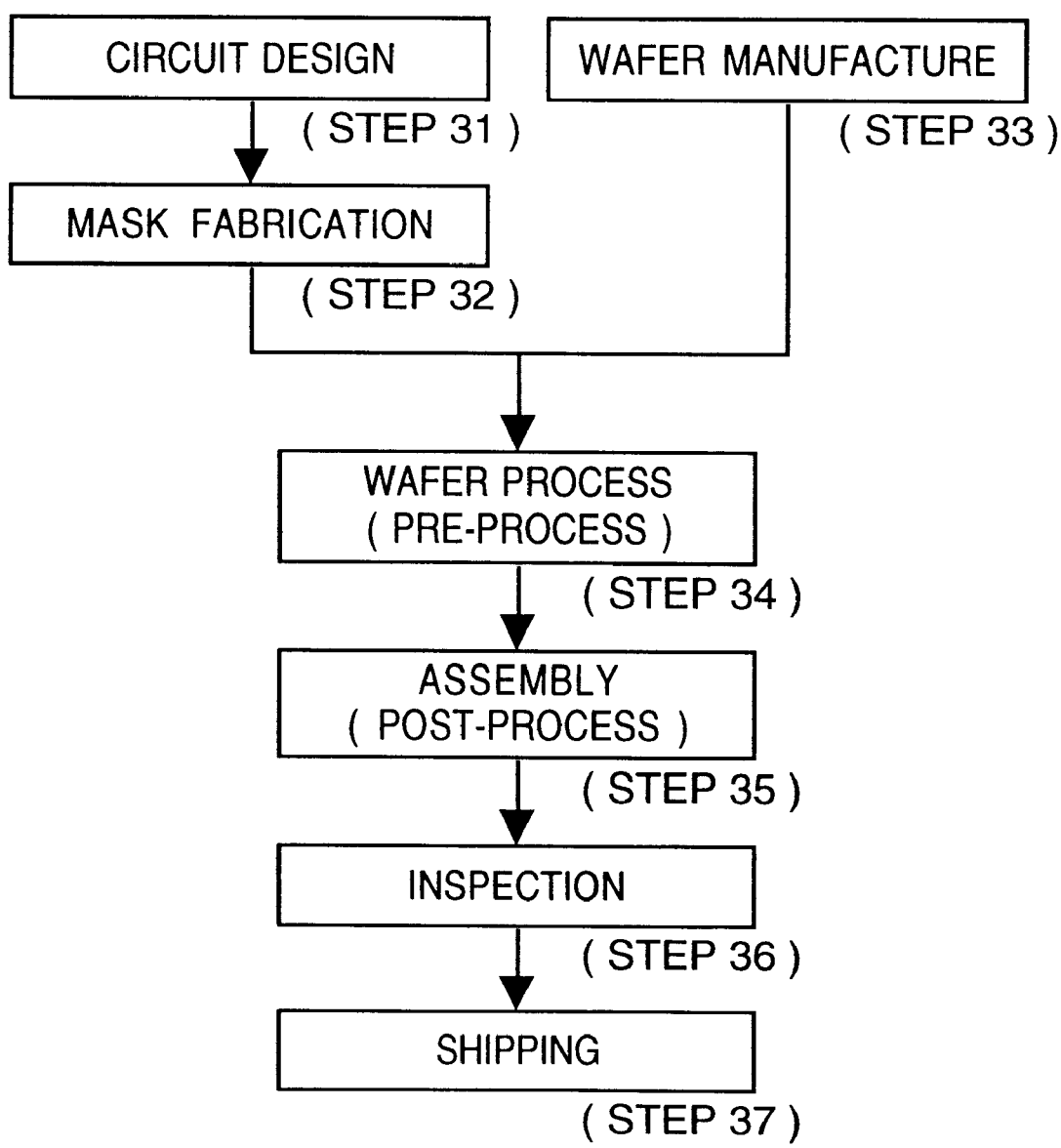
FIG. 10 is a flowchart illustrating the flow of manufacture of a microdevice capable of being manufactured by the apparatus of FIG. 1.

FIG. 10 illustrates the flow of manufacture of a microdevice (e.g., semiconductor chip such as an IC or LSI chip, a liquid crystal panel, a CCD, a thin-film magnetic head, a micromachine, etc.). The circuitry of the semiconductor device is designed at step 31 (circuit design). A mask on which the designed circuit pattern has been formed is fabricated at step 32 (mask fabrication). Meanwhile, a wafer is manufactured using a material such as silicon at step 33 (wafer manufacture). By employing the scanning exposure apparatus described above, the actual circuit is formed on the wafer by lithography, using the mask and wafer that have been prepared, at step 34 (wafer process), which is also referred to as a "pre-process". A semiconductor chip is obtained, using the wafer fabricated at step 34, at step 35 (assembly), which is also referred to as a "post-process". This step includes steps such as actual assembly (dicing and bonding) and packaging (chip encapsulation). The semiconductor device fabricated at step 35 is subjected to inspections such as an operation verification test and durability test at step 36 (inspection). The semiconductor device is completed through these steps and then is shipped (step 37).

Figure 11:
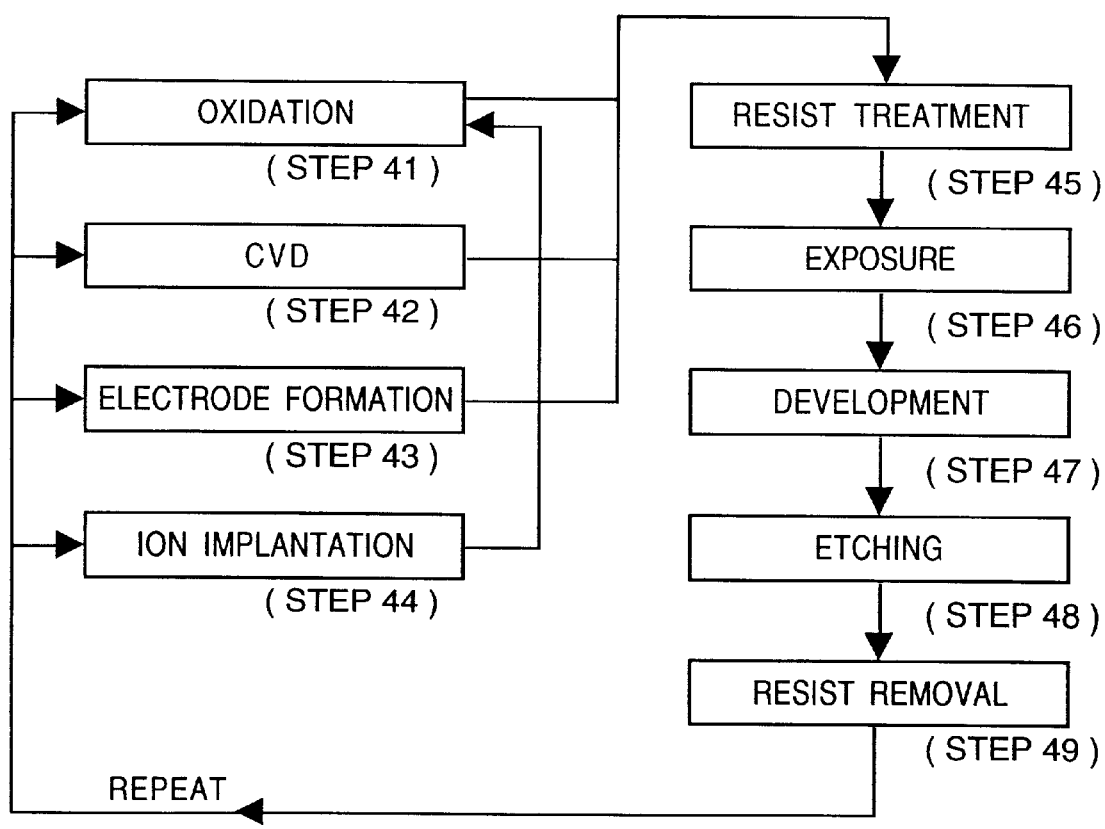
FIG. 11 is a flowchart illustrating the detailed flow of a wafer process in FIG. 10.

FIG. 11 is a flowchart illustrating the detailed flow of the wafer process mentioned above. The surface of the wafer is oxidized at step 41 (oxidation). An insulating film is formed on the wafer surface at step 42 (CVD), electrodes are formed on the wafer by vapor deposition at step 43 (electrode formation), and ions are implanted in the wafer at step 44 (ion implantation). The wafer is coated with a photoresist at step 45 (resist treatment), the wafer is exposed to the circuit pattern of the mask to print the pattern onto the wafer by the above-described exposure apparatus at step 46 (exposure), and an exposed wafer is developed at step 47 (development). Portions other than the developed photoresist are etched away at step 48 (etching), and an unnecessary resist left after etching is performed is removed at step 49 (resist removal). Multiple circuit patterns are formed on the wafer by implementing these steps repeatedly.

If the manufacturing method of this embodiment is employed, semiconductor devices having a high degree of integration can be manufactured at low cost. Manufacture of such semiconductor devices using the prior-art techniques is difficult.

[Second Embodiment]

Figure 6:
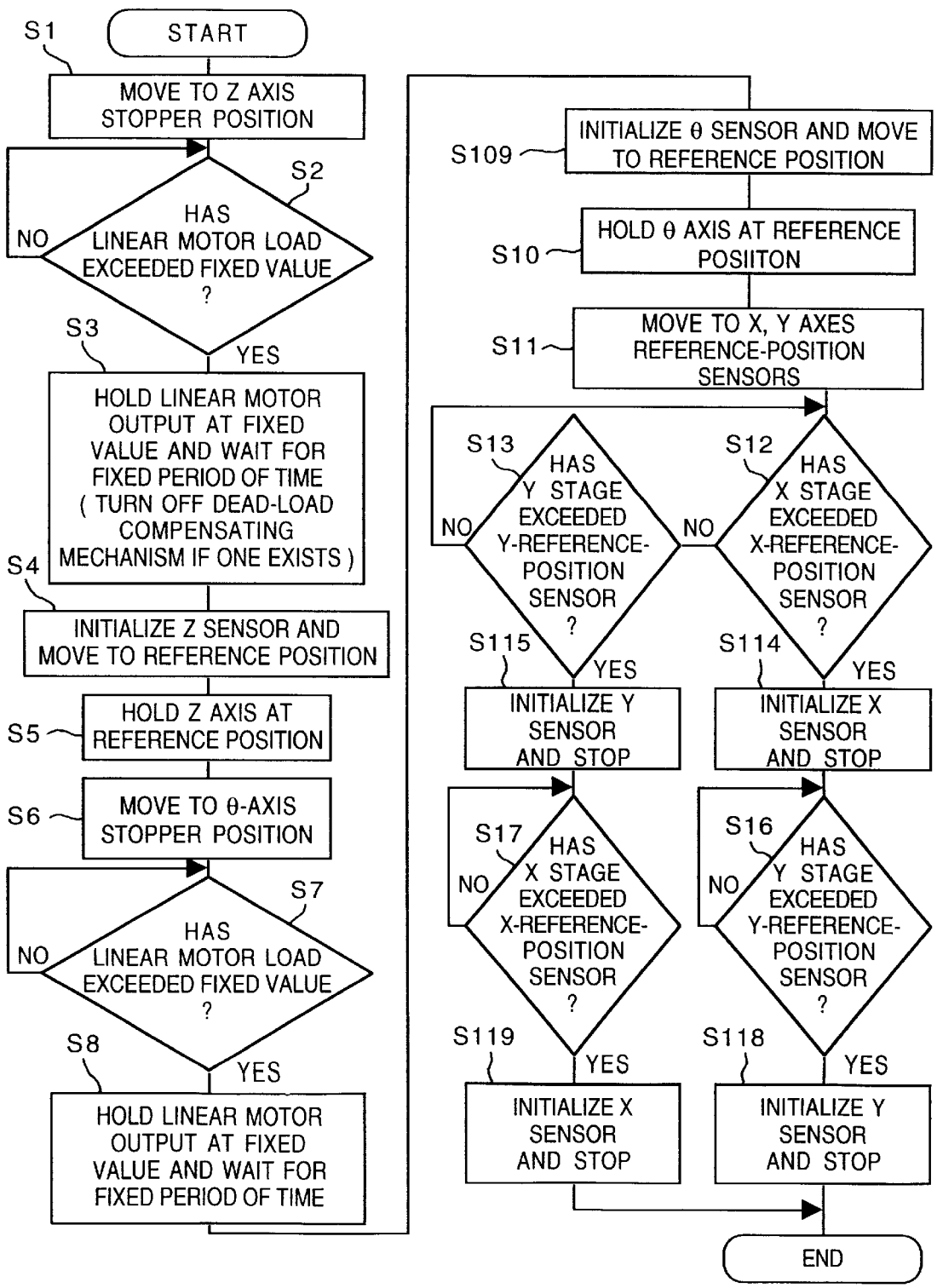
FIG. 6 is a flowchart illustrating a reference-position return operation in a stage device of an optical exposure apparatus according to a second embodiment of the present invention.

FIG. 6 is a flowchart illustrating a reference-point return operation in a stage device of an optical exposure apparatus according to a second embodiment of the present invention. This embodiment differs from the first embodiment in terms of the hardware involved. Specifically, instead of measuring position in the θ direction using two Y laser interferometers, this embodiment uses a θ sensor (not shown) to measure position in the θ direction. Further, instead of using an X laser interferometer and a Y laser interferometer to measure the positions of the X and Y stages, this embodiment employs X and Y sensors such as a linear encoder to measure the positions of the X and Y stages.

In terms of operation, it will suffice to initialize the θ sensor at step S109 in FIG. 6. This is performed instead of adopting the value measured by the laser interferometer at step S9 in FIG. 5 as the provisional reference point. Further, it will suffice to initialize the X sensor or the Y sensor at steps S114, S115, S118 and S119 in FIG. 6. This is performed instead of initializing the X laser or Y laser at steps S14, S15, S18 and S19 in FIG. 5. [Third Embodiment]

FIG. 6 is a flowchart illustrating a reference-point return operation in a stage device of an optical exposure apparatus according to a third embodiment of the present invention. This embodiment differs from the second embodiment in terms of the hardware involved. Specifically, in order to detect that the precision stage 81 is at a predetermined position and in a predetermined attitude, detection is performed by reference-position sensors without relying upon contact between the stoppers 91a and 91b. That is, instead of the stoppers 91a, 91b, there are provided Z reference-position sensors which, when the precision stage 81 is moved in the Z direction, sense that the three points on the precision stage 81 in the vicinity of the linear motors 82 have passed respective ones of predetermined positions along the Z axis. Further, instead of the stopper member for the θ direction, there is provided a θ reference-position sensor which, when the precision stage 81 is moved in the θ direction, senses that a predetermined single point on the precision stage 81 has passed a predetermined position in the θ direction.

As shown in FIG. 3, the Z reference-position sensor 101 comprises a photo sensor 101a fixed on the base 91 and a plate 101b fixed on the bottom surface of the precision stage 81. The θ reference-position sensor has a similar arrangement.

In this case, reference-point return of each of the displacement sensors 89 which measure position in the Z direction involves first driving each of the linear motors 82 in such a manner that the precision stage 81 is moved in the direction of each of the Z reference-position sensors (step S21). Next, the Z reference-position sensors sense whether the predetermined three points on the precision stage 81 have passed the respective detection points of these sensors (step S22). When this has been sensed with regard to these Z reference-position sensors, the corresponding displacement sensors 89 are initialized, reference-point return of each of the displacement sensors 89 is terminated and each of the linear motors 82 is driven using the displacement sensors 89 for-which reference-position return has been performed, thereby moving the precision stage 81 to the predetermined reference position (step S4).

Next, reference-point return is carried out with regard to the θ sensor. Specifically, while the reference position of step S4 is maintained (step S5), the linear motor 83 is driven to rotate the precision stage 81 in the θ direction and whether a predetermined point on the precision stage 81 has passed the detection point of the θ reference-position sensor is sensed (step S27). If this is sensed, the θ sensor is initialized, reference-point return of the θ sensor is completed and the linear motor 83 is driven to make the position of the precision stage 81 in the θ direction the predetermined reference position (step S109).

The processing from step S10 onward is the same as in the case of FIG. 6. This processing is executed to perform reference-point return with regard to the X and Y laser interferometers.

Thus, in accordance with the present invention, as described above, the position of the precision stage in the direction of the Z axis and in the oblique directions is held at a predetermined reference position, in which state reference-position return of the θ position measuring means (the two Y laser interferometers 23-1, 23-2 or the θ sensor in the embodiments) is performed. As a result, reference-position return of the θ position measuring means can be performed accurately. Here, it is so arranged that reference-position return of the Z position measuring means (the displacement sensors 89-1~89-3 in the embodiments) is carried out before reference-position return of the θ position measuring means. This makes it possible to perform reference-position return of the θ position measuring means more accurately. In particular, reference-point return can be performed in an accurate fashion also in an arrangement (e.g., one which uses two Y laser interferometers) in which the θ position measuring means performs measurement along two measurement axes to obtain the position of the precision stage in the θ direction.

Further, after the θ position measuring means is returned to its reference position, positions along the direction of the Z axis, along the oblique directions and in the θ direction are held at predetermined reference positions, in which state reference-position return of the X and Y position measuring means (the X and Y laser interferometers or X and Y sensors in the embodiments) is carried out. As a result, reference-position return of the X and Y position measuring means can be performed in an accurate fashion.

Further, when the precision stage strikes a stopper and the driving load thereof exceeds a fixed value, or when the traveling speed of the stage falls below a fixed value, the load of the driving means is maintained for a fixed period starting from this time and then the corresponding measuring means is initialized. This makes it possible to perform reference-position return more accurately.

In a case where the Z drive means performs dead-load compensation (i.e., supplies an air stream by the Z linear motors 82-1~82-3 and porous pad 86), reference-position return of the Z position measuring means is performed by bringing the precision stage into abutting contact with a stopper, halting the dead-load compensating operation when the load of the Z drive means exceeds a fixed value or when the speed of the precision stage falls below a fixed value, maintaining the output of the Z drive means for a fixed period of time starting at this time and then initializing the Z position measuring means. As a result, the reference-position return of the Z position measuring means can be performed more accurately.

Further, by virtue of the stagedevice in which accurate reference-position return can be performed in the manner described, the exposure apparatus according to the present invention is capable of improving the positioning accuracy of a substrate undergoing exposure as well as the accuracy with which the substrate is moved in the scanning direction.

Further, since it is so arranged that accurate reference-position return is carried out as described above, after which the substrate placed on the precision stage is subjected to exposure, the device manufacturing method of the present invention makes it possible to manufacture devices using highly precise exposure patterns.

As many apparently widely different embodiments of the present invention can be made without departing from the spirit and scope thereof, it is to be understood that the invention is not limited to the specific embodiments thereof except as defined in the appended claims.

What is claimed is:

1. A reference-position return method in a stage device having a first stage provided so as to be movable in four directions, namely in a direction along a Z axis, in a θ direction, which is a direction of rotation about the Z axis, and in two oblique directions inclined with respect to the Z axis, said method comprising:

a first control step of controlling first drive means for moving said first stage in the four directions to move said first stage to a reference position relating to the direction along the Z axis and the oblique directions; and a second control step of controlling said first drive means to perform reference-position return of θ measuring means, which measures position of said first stage in the θ direction, while holding said first stage at the reference position.

2. The method according to claim 1, wherein-said θ measuring means has two laser interferometers for measuring the position of said first stage along two measurement axes in order to obtain the position of said first stage in the θ direction.

3. The method according to claim 1, wherein said stage device further has second drive means for moving, in X and Y directions, a second stage carrying said first stage and movable in X and Y directions in a plane perpendicular to the Z axis, and XY measuring means for sensing the position of a portion of said first stage to thereby measure position of said first stage in the X direction and position of said first stage in the Y direction;

said method further comprising a third control step of holding said first stage at a predetermined reference position in regard to the four directions based upon results of reference-position return performed by said first and second control steps, driving said second stage by said second drive means and performing reference-position return of said XY measuring means by sensing position of a portion of said first stage.

4. The method according to claim 3, wherein said third control step performs reference-position return of said XY measuring means and performs reference-position return of said θ measuring means again.

5. The method according to claim 3, wherein said-stage device further has a displacement sensor for measuring position of said first stage in the θ direction separately of said θ measuring means;

said second control step performs reference-position return of said displacement sensor while holding said first stage at the reference position; and said third control step holds said first stage at a predetermined reference position relating to the four directions decided based upon results of reference-position return by said first and second control steps, and drives said second stage by said second drive means to perform reference-position return of said XY measuring means and reference-position return of said θ measuring means.

6. The method according to claim 1, wherein said stage device further has Z measuring means for measuring the position of said first stage along the direction of the Z axis at least at three points on said first stage in order to measure the position of said first stage along the direction of the Z axis and in the oblique directions, wherein said first control step controls said first drive means to perform reference-position return of said Z measuring means and moves said first stage to the reference position based upon results of reference-position return.

7. The method according to claim 6, wherein said first control step performs reference-position return of said Z measuring means by moving said first stage toward a stopper, which limits movement of said first stage in the direction along the Z axis, by said first drive means, maintaining an output from said first drive means at a predetermined level over a predetermined period of time after load upon said first drive means has exceeded a predetermined value, and then initializing said Z measuring means.

8. The method according to claim 7, wherein the direction along the direction of the Z axis in said stage device is the vertical direction and the stage device further has compensating means for compensating for a load due to the force of gravity when said first stage is moved along the direction of the Z axis by said first drive step;

said first control step having a halting step of halting operation of said compensating means over the predetermined period of time during which the output of said first drive means is held at the predetermined level.

9. The method according to claim 6, wherein said first control step performs reference-position return of said Z measuring means by moving said first stage toward a stopper, which limits movement of said first stage in the direction along the Z axis, by said first drive means, maintaining an output from said first drive means at a predetermined level over a predetermined period of time after traveling speed of said first stage has fallen below a predetermined value, and then initializing said Z measuring means.

10. The method according to claim 7, wherein the direction along the direction of the Z axis in said stage device is the vertical direction and the stage device further has compensating means for compensating for a load due to the force of gravity when said first stage is moved along the direction of the Z axis by said first drive step;

said first control step having a halting step of halting operation of said compensating means over said predetermined period of time during which the output of said first drive means is held at the predetermined level.

* * * * *

UNITED STATES PATENT AND TRADEMARK OFFICE
CERTIFICATE OF CORRECTION

PATENT NO. : 6,008,882

DATED : December 28, 1999

INVENTOR(S): HIROHITO ITO, ET AL.                              Page 1 of 4

It is certified that error appears in the above-identified patent and that said Letters Patent is hereby corrected as shown below:

ON THE COVER PAGE: The illustration Figure,
In step "S10", "HOLD θ AXIS AT REFERENCE POSIITON" should read
--HOLD θ AXIS AT REFERENCE POSITION--.

IN THE DRAWINGS:
SHEET NO. 5:
Figure 5, In step "S10", "HOLD θ AXIS AT REFERENCE POSIITON"
should read --HOLD θ AXIS AT REFERENCE POSITION--.

SHEET NO. 6:
Figure 6, In step "S10", "HOLD θ AXIS AT REFERENCE POSIITON"
should read --HOLD θ AXIS AT REFERENCE POSITION--.

Figure 7:
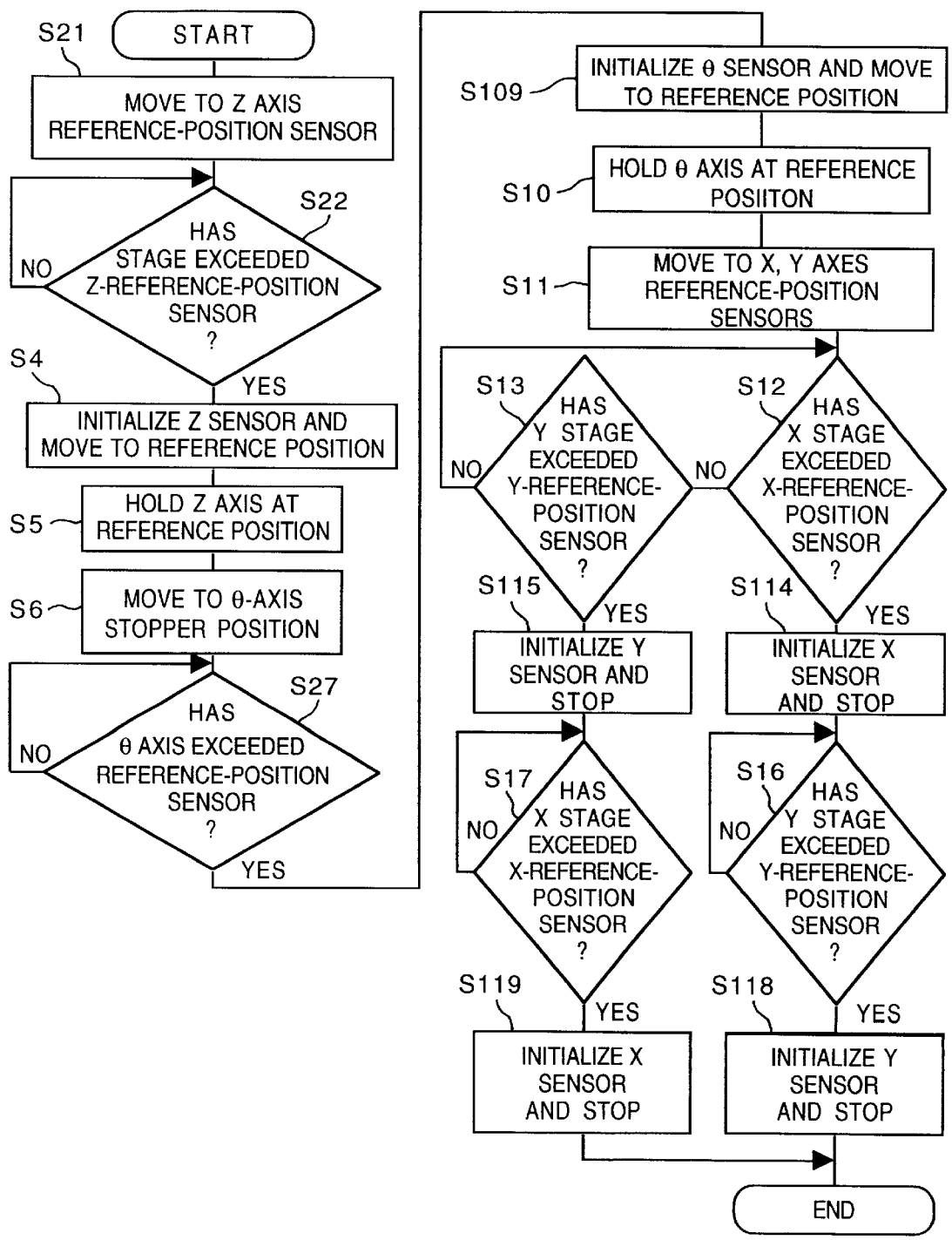
FIG. 7 is a flowchart illustrating reference-position return operation in a stage device of an optical exposure apparatus according to a third embodiment of the present invention.

SHEET NO. 7:
Figure 7, In step "S10", "HOLD θ AXIS AT REFERENCE POSIITON"
should read --HOLD θ AXIS AT REFERENCE POSITION--.

COLUMN 1:
Line 37, "adequate," should read --adequate--; and
Line 51, "interferometty" should read --interferometry--.

UNITED STATES PATENT AND TRADEMARK OFFICE
CERTIFICATE OF CORRECTION

PATENT NO. : 6,008,882

DATED : December 28, 1999

INVENTOR(S): HIROHITO ITO, ET AL.

It is certified that error appears in the above-identified patent and that said Letters Patent is hereby corrected as shown below:

COLUMN 2:
Line 13, "measuring-means" should read --measuring means--;
Line 29, "$\theta$-positionmeasuring" should read --$\theta$-position measuring--; and
Line 37, "$\theta$ position" should read --$\theta$-position--.

COLUMN 3:
Line 2, "$\theta$ position" should read --$\theta$-position--;
Line 9, "$\theta$ position" should read --$\theta$-position--; and
Line 26, "$\theta$ position" should read --$\theta$-position--.

COLUMN 4:
Line 62, "The-stage" should read --The stage--.

COLUMN 6:
Line 50, "precision" should read --the precision--.

COLUMN 9:
Line 6, "along-the" should read --along the--; and
Line 40, "(e.g.," should read --(e.g., a--.

UNITED STATES PATENT AND TRADEMARK OFFICE
CERTIFICATE OF CORRECTION

PATENT NO. : 6,008,882

DATED : December 28, 1999

INVENTOR(S): HIROHITO ITO, ET AL.

It is certified that error appears in the above-identified patent and that said Letters Patent is hereby corrected as shown below:

COLUMN 10:
Line 5, "an" should read --any--; and
Line 34, "[Third" should read --¶ [Third--.

COLUMN 11:
Line 28, "θ position" should read --θ-position--;
Line 31, "θ position" should read --θ-position--;
Line 35, "θ position" should read --θ-position--;
Line 37, "θ position" should read --θ-position--;
Line 41, "θ position" should read --θ-position--; and
Line 44, "θ position" should read --θ-position--.

UNITED STATES PATENT AND TRADEMARK OFFICE
CERTIFICATE OF CORRECTION

PATENT NO. : 6,008,882

DATED : December 28, 1999

INVENTOR(S): HIROHITO ITO, ET AL.

It is certified that error appears in the above-identified patent and that said Letters Patent is hereby corrected as shown below:

COLUMN 12:
Line 5, "stagedevice" should read --stage device--;
Line 50, "direction;" should read --direction,--; and
Line 64, "said-stage" should read --said stage--.

Signed and Sealed this

Sixth Day of February, 2001

Attest:

Q. TODD DICKINSON

Attesting Officer

Director of Patents and Trademarks